United States Patent [19]

Sato et al.

[11] Patent Number: 4,506,977

[45] Date of Patent: Mar. 26, 1985

[54] TRANSFER APPARATUS PROVIDED WITH AN AUTO-FOCUSING MECHANISM

[75] Inventors: Hiroshi Sato, Tokyo; Shuichi Yabu, Kawasaki; Masao Kosugi, Yokohama, all of Japan

[73] Assignee: Canon Kabushiki Kaisha, Tokyo, Japan

[21] Appl. No.: 482,812

[22] Filed: Apr. 7, 1983

[30] Foreign Application Priority Data

Apr. 14, 1982 [JP] Japan .................... 57-62874

[51] Int. Cl.³ .................. G03B 27/42; G03B 27/52
[52] U.S. Cl. ............................. 355/53; 355/55; 355/56; 356/399; 356/400
[58] Field of Search ............... 355/55, 56, 68, 45, 355/38, 53; 356/218, 226, 227, 399, 400

[56] References Cited

U.S. PATENT DOCUMENTS

| | | | |
|---|---|---|---|
| 4,084,903 | 4/1978 | Pircher | 355/53 |
| 4,087,180 | 5/1978 | DiNatale | 355/32 X |
| 4,140,392 | 2/1979 | Lacombat et al. | 355/53 X |
| 4,155,642 | 5/1979 | Lacombat | 355/53 |
| 4,236,818 | 12/1980 | Fauchier | 355/68 X |
| 4,274,732 | 6/1981 | Thurm et al. | 355/38 |
| 4,371,259 | 2/1983 | Howitt | 355/38 |
| 4,383,757 | 5/1983 | Phillips | 355/53 |

*Primary Examiner*—John Gonzales
*Assistant Examiner*—Della J. Rutledge
*Attorney, Agent, or Firm*—Fitzpatrick, Cella, Harper & Scinto

[57] ABSTRACT

A transfer apparatus comprises a projection device operable with a photomask having a semiconductor circuit pattern therein and includes a projection lens for projecting the image of the photomask to a photosensitive member sensitive to the image of the photomask projected by the projection lens. The apparatus further includes an illuminating device for illuminating the photomask, a memory circuit for storing the time characteristic $\Delta l$ of a focus error occurring in the projection lens due to the exposure light from the photomask having passed through the projection lens, a history detector for detecting the illuminating history $to/t$ of the illuminating device, a transmission signal forming device for forming a transmission signal regarding the transmission factor $\tau$ of the photomask used, a length measuring device for measuring the length of a part of the optical path between the photomask and the photosensitive member, an operation circuit for calculating a proper value in accordance with the output of the memory circuit, the output of the history detector and the transmission signal, and an adjusting device for adjusting the length of the optical path of the projection device until the proper value and the value measured by the length measuring device are in accord with each other.

15 Claims, 2 Drawing Figures

TRANSFER APPARATUS PROVIDED WITH AN AUTO-FOCUSING MECHANISM

BACKGROUND OF THE INVENTION

1. Field of the Invention

This invention relates to an apparatus for compensating for focus error occurring in a device for projecting a negative onto a photosensitive member. More particularly, it relates to an apparatus for correcting focus error occurring in the projection system of a mask aligner when an integrated circuit pattern on a photomask or a reticle is transferred onto a wafer during the semiconductor manufacturing process.

2. Description of the Prior Art

In recent years, the advancement in the manufacture of patterns of semiconductor elements such as IC, LSI and VLSI toward minuteness and higher integration has been remarkable and the pattern line width required is approaching 1 to 2 $\mu$m. What is required to achieve minute patterns with higher integration is the provision of an exposure device having a printing function of printing minute patterns of 1 to 2 $\mu$m and an aligning function of accurately aligning each pattern in a plurality of steps of the manufacturing process as well as provide for a device that causes less defects to the wafer.

To meet these requirements, there have been developed various projection exposure devices (the reduction lens projection type, the one-to-one magnification lens projection type, the mirror projection type, etc.). The resolving power of a projection exposure device capable of printing minute patterns of 1 to 2 $\mu$m is determined by the effective F-number of the projection optical system thereof and the wavelength $\lambda$ of the printing light. The depth of focus of such a device is defined by $\Delta Z = \pm 2\lambda Fe^2$.

In the case of reduction projection exposure devices having the printing function of 1 $\mu$m which are presently provided, the printing light utilized has a wave light of 0.436 $\mu$m. The device uses an optical system on the order of $Fe=1.4$ and the depth of focus matching this is on the order of $\pm 1.7$ $\mu$m. Therefore, in these projection exposure devices, it is a requisite condition to have a focus adjusting mechanism for reliably imaging a photomask pattern on the surface of a wafer, and various methods therefor have heretofore been provided.

The focus adjusting mechanisms presently provided may be generally classified into two types. A first type is the T.T.L. type in which the position of a wafer is detected through a projection optical system and the wafer is always adjusted to the best imaging position. A second type is the constant distance type in which a wafer is always adjusted at a constant distance relative to a projection optical system. The T.T.L. type system requires a complicated optical system, suffers from various limitations in the design of the projection optical system and thus, at present, most projection exposure devices adopt the constant distance type system.

The wafer position detecting methods of the constant distance type presently provided include the method using an air micrometer, the method using an electrical non-contact micrometer, and the method using an optical system. Any of these methods has a wafer position detection accuracy on the order of $\pm 0.3$ $\mu$m and is combined with a focus adjusting mechanism so as to be sufficiently able to set a wafer always at a constant distance capable of satisfying the depth of focus relative to the projection optical system.

However, the constant distance type system suffers from the following disadvantage. In the case of the constant distance type system, a wafer is always set at a constant distance relative to the projection optical system and therefore, to ensure that the wafer lies at the best imaging position, it is a necessary that the best imaging position of the projection optical system do not vary.

However, it is generally known that when a printing light is applied to the projection optical system to effect the printing of the wafer, the projection optical system absorbs part of the printing light and the optical performance thereof varies with heat and the best imaging position is displaced. It is for this reason that development of an optical system which will suffer less from variation in optical performance due to the application of the printing light is desired.

SUMMARY OF THE INVENTION

It is an object of the present invention to compensate for focus error occurring during a transfer operation.

It is another object of the present invention to pre-store the focus variation characteristic of the projection optical system for the applied light, choose the amount of correction on the basis of the stored information and re-adjust the apparatus.

The invention will become fully apparent from the following detailed description thereof taken in conjunction with the accompanying drawings.

DESCRIPTION OF THE PREFERRED EMBODIMENT

Figure 1:
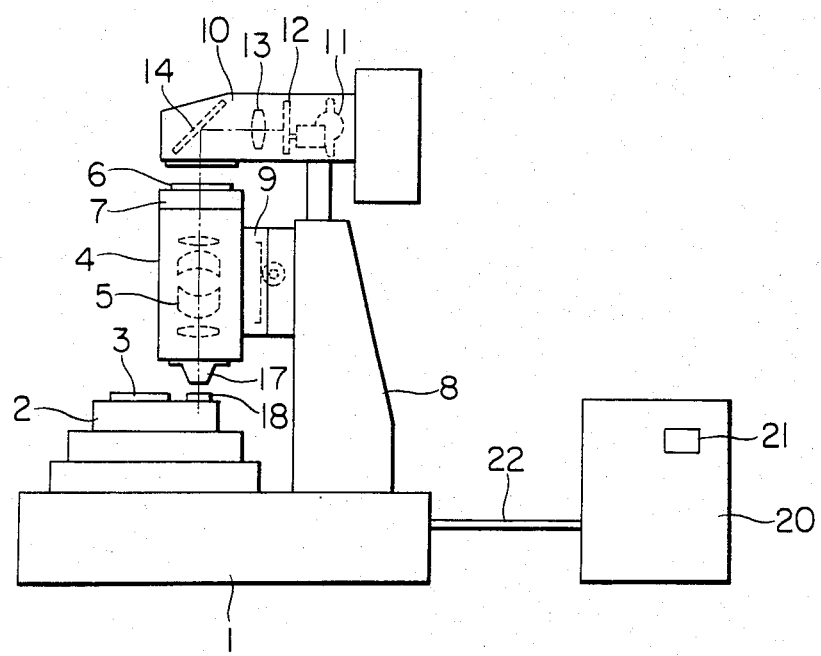
FIG. 1 is a side view of an embodiment of the present invention.

Referring to FIG. 1, reference numeral 1 designates a body base and reference numeral 2 denotes an XY stage. The XY stage 2 is movable in a desired plane by a well-known mechanism mounted on the body base 1. Designated by 3 is a wafer having a photosensitive layer. The wafer 3 is fixed to the XY stage 2 by an adsorbing chuck, not shown. Denoted by 4 is a projection lens barrel containing a reduction type projection lens 5 therein. Reference numeral 6 designates a photomask provided with a semiconductor circuit pattern. Designated by 7 is a photomask stage secured to the upper portion of the lens barrel 4 and having the function of fixing the photomask 6.

Reference numeral 8 denotes a strut secured to the body base 1. The upper portion of the strut 8 is provided with the fixed side of a focus adjusting mechanism 9. The focus adjusting mechanism 9 may comprise, for example, a rack and a pinion or a helicoid, and the movable side thereof is coupled to the lens barrel 4. When the mechanism 9 is actuated, the lens barrel 4 may move along the projection optical path. Instead of the entire projection lens being moved, a certain element of the projection lens may be moved. Designated by 10 is an illuminating unit secured to the upper portion of the strut 8 through another strut. The illuminating unit 10 contains therein a light source 11 such as a mercury lamp, a shutter blade 12, a condenser lens 13 and an optical path bending mirror 14. The shutter blade 12 is movable by the action of a rotary type solenoid operated by a drive signal to shut off or open the illumination optical path. When the illumination optical path is opened, the light beam emitted from the illuminating light source 11 is converged by the condenser lens 13 and reflected by the mirror 14, whereafter it irradiates the photomask 6. Reference numeral 17 designates an air nozzle held on the lower end of the lens barrel 4 and disposed on the marginal edge of the projection optical path or movable into and out of the optical path. The air nozzle 17 is connected to an air micrometer body, not shown, and is useful to precisely measure the spacing between the upper surface of the wafer 3 and the last surface of the projection lens 5. Alternatively, measurement of the spacing may be effected by a non-contact type electric micrometer or an optical type length measuring device. Reference numeral 18 designates a photodetector fixedly or removably secured to the XY stage 2. The photodetector 18 can be moved into the illumination area operation of XY stage 2. The photodetector 18 has the function of photometrically measuring the pattern projection light transmitted through the photomask 6 and measuring the transmission factor of the photomask. As regards a photomask whose transmission factor is already known or a photomask whose transmission factor has been found by another measuring device, the condition thereof may be set by a transmission factor setting switch 21 provided in a controller 20. This switch 21 should desirably be disposed with the photodetector. Designated by 22 is a cable having the function of transmitting the signal from the controller 20 to the body of a semiconductor printing apparatus.

In the apparatus of the above-described construction, if the printing process is repeated, the focus of the projection lens 5 will be moved as described above, and the amount of variation in the focus of the projection lens with time by the application of printing light can be empirically expressed as $\Delta l = K \cdot \tau \cdot E \cdot to/t$, where $\Delta l$ is the amount of variation in the focus, K is the focus variation coefficient intrinsic to the projection lens, $\tau$ is the transmission factor of the photomask, E is the quantity of light applied from the illuminating unit per unit time, to is the total opening time of the shutter, and t is the total exposure interval time.

Here, if the focus variation coefficient K intrinsic to the projection lens is measured by an experiment, the same K can be used in an apparatus incorporating the same projection lens therein.

Figure 2:
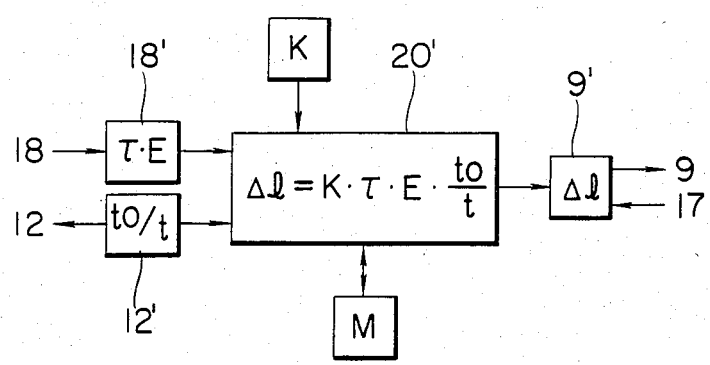
FIG. 2 is a block diagram of a signal processing system.

In FIG. 2, reference numeral 20' designates a microprocessor which constitutes the center of the controller 20 and pre-stores the aforementioned condition regarding $\Delta l$ and the focus variation coefficient K in a memory M. The storing method is not limited to electrical means, but mechanical means such as a cam can also be utilized.

Subsequently, the photomask 6 to be used in that process is set on the mask stage 7, the XY stage 2 is moved, the photodetector 18 is positioned in the projection optical path, the shutter 12 is opened, the printing light transmitted through the photomask 6 is photometrically measured by the photodetector 18, and a signal corresponding to the quantity of transmitted light $\tau \cdot E$ is applied from a detecting circuit 18' to the microprocessor 20'. Thereafter, the shutter 12 is closed, the XY stage 2 is moved to set the wafer 3 at the printing position, the shutter 12 is again opened and the circuit pattern is printed onto the wafer. In that case, the amount of variation $\Delta l$ in the focus during the first printing is 0 and therefore, the distance between the projection lens and the wafer measured by the air injection from the air nozzle 17 is in accord with the design value. It is to be understood that the focus adjusting mechanism 9 is operated to set the focus position so as to be the design value.

When the printing of the wafer 3 is terminated, the XY stage 2 is moved and this wafer is replaced with another wafer, and the XY stage 2 is again moved to set the new wafer at the printing position. On the other hand, the shutter driving control circuit 12' controls the opening of the shutter and also applies to the microprocessor 20' an irradiation history determined by the total shutter opening time to and the exposure interval time t. The microprocessor 20' integrates each time the shutter opening and the exposure interval occur, and the stores them as the exposure history to/t in the memory M. Prior to the current exposure, the microprocessor 20' effects an operation on the basis of K, $\tau \cdot E$ and to/t and calculates the value of $\Delta l$. The value of $\Delta l$ is applied as input to the focus adjusting control circuit 9', whereupon the focus adjusting mechanism 9 is operated to move the lens barrel 4 slightly and continues its adjusting operation until the amount of variation detected by the air micrometer (not shown) becomes equal to the calculated amount of variation in the focus. Thus, the wafer is automatically positioned always at the best imaging position of the projection lens 5. In the present embodiment, for the simplification of the mechanism, the projection lens barrel 4 has been moved, but alternatively the wafer stage 2 may be vertically moved. Also, in FIG. 1, the photomask stage 7 is provided on the projection lens barrel 4, but alternatively the photomask stage 7 may be independently mounted on the strut 8 for vertical movement and the photomask 6 may be moved to adjust the imaging position. Further, a light-transmitting element capable of varying the length of the optical path may be disposed in the projection optical path to vary the length of the optical path of this element and thereby adjust the imaging position.

According to the present invention described above, any fluctuation of the focus occurring when the projection optical system is continuously used can be corrected without the necessity of using a complex instrument such as a T.T.L. system. The instruments required for the correction has heretofore been very expensive, but according to the present invention, a device for focus control can be realized at a low cost and in addition, no great change is required in the other portions of the apparatus. The present invention is applicable not only to semiconductor printing apparatus but also to other copying apparatus.

What is claimed is:

1. A transfer apparatus for transferring an image on a negative to a photosensitive member, said apparatus comprising:

an exposure device for exposing a photosensitive member to light, said exposure device including negative holding means for holding a negative, photosensitive member holding means for holding a photosensitive member, an image forming optical system for forming the image on the negative onto the photosensitive member, and means for holding the image forming optical system;

illuminating means for producing exposure light to illuminate the negative to expose the photosensitive member through said image forming optical system;

detecting means for detecting the illumination history of said illuminating means and producing a history signal;

length measuring means for measuring the length of at least a part of the optical path of said exposure device between the negative and the photosensitive member and for producing a measured length signal representing the measured length;

means for storing the characteristic of variation in focus of said exposure device, as a function of the illumination history, induced by the light produced by said illumination means to illuminate the negative and passing through said image forming optical system;

operation means for calculating a proper length value from said characteristic of the variation in focus stored in said storing means, and said history signal produced by said detecting means; and varying means for varying the length of a part of the optical path of said exposure device until the measured length signal measured by said length measuring means becomes equal to the proper length value.

2. A transfer apparatus according to claim 1, wherein said varying means moves said means for holding the image forming optical system in the direction of said optical path.

3. A transfer apparatus according to claim 2, wherein said image forming optical system is a projection lens.

4. A transfer apparatus according to claim 1, wherein said varying means moves said photosensitive member holding means in the direction of said optical path.

5. A transfer apparatus according to claim 4, wherein said photosensitive member holding means comprises a chuck for holding a wafer and a movable stage for supporting said chuck thereon.

6. A transfer apparatus according to claim 1, further comprising means for determining the transmission factor of the negative and for producing a transmission signal representative of the transmission factor, said operation means further calculating the proper length value also from the transmission signal; said determining means comprising a photodetector for receiving the light passed through said negative.

7. A transfer apparatus according to claim 1, wherein the negative is a photomask provided with an integrated circuit pattern.

8. A transfer apparatus according to claim 6, wherein said photodetector is disposed on said photosensitive member holding means.

9. A transfer apparatus according to claim 1, wherein said length measuring means is an air micrometer having a nozzle through which gas is ejected toward said photosensitive member holding means.

10. A mask aligner for aligning a photomask having an image thereon and a wafer, said mask aligner comprising:

a mask stage for holding a photomask thereon;

a movable wafer stage for holding a wafer thereon;

a projection lens for projecting the image of the photomask onto the wafer;

a holding mechanism for holding said projection lens;

illuminating means for producing an exposure light to illuminate the photomask to expose the wafer with the image of the photomask through said projection lens, said illuminating means being capable of effecting the control of illumination and stoppage of illumination;

detecting means connected to said illuminating means for detecting the illumination history thereof and producing a history signal;

light-receiving means for receiving an exposure light from said illuminating means passed through the photomask and said projection lens, said light-receiving means being disposed on said wafer stage to measure the transmission factor of said photomask and for producing a transmission factor signal representative thereof;

a distance measuring air micrometer having a nozzle for ejecting therethrough air toward said wafer stage, said nozzle being coupled to said holding mechanism, said air micrometer measuring the length of at least a part of the optical path between the photomask and the wafer and producing a measured length signal representative thereof;

means for storing the time characteristic of the focus error of said projection lens caused by the passage of exposure light therethrough;

operation means for calculating a proper value from the time characteristic of said focus error stored in said storing means, said history signal produced by said detecting means, and the transmission factor signal; and adjusting means for adjusting the spacing between said photomask and said projection lens through at least one of said mask stage and said holding mechanism so that the measured length signal produced by said air micrometer becomes equal to said proper value calculated by said operation means.

11. A mask aligner according to claim 10, further comprising signal producing means for producing a signal regarding the known transmission factor of said photomask and applying it to said operation means.

12. A mask aligner according to claim 10, wherein said adjusting means adjusts the position of said projection lens in the direction of the optical axis thereof.

13. A mask aligner according to claim 10, wherein said adjusting means adjusts the positon of said wafer stage in the direction of the optical axis of said projection lens.

14. A mask aligner according to claim 10, wherein said illuminating means is provided with a light source, light condensing means and a shutter.

15. A transfer apparatus according to claim 1, further comprising means for determining the transmission factor of the negative; and for producing a transmission signal representative of the transmission signal; said operation means further calculating the proper length value also from the transmission signal.

* * * * *